US010460997B2

(12) United States Patent
Liou et al.

(10) Patent No.: US 10,460,997 B2
(45) Date of Patent: Oct. 29, 2019

(54) MANUFACTURING METHOD OF SEMICONDUCTOR DEVICE

(71) Applicant: UNITED MICROELECTRONICS CORP., Hsin-Chu (TW)

(72) Inventors: En-Chiuan Liou, Tainan (TW); Yu-Cheng Tung, Kaohsiung (TW); Chih-Wei Yang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/360,019

(22) Filed: Mar. 21, 2019

(65) Prior Publication Data

US 2019/0221482 A1 Jul. 18, 2019

Related U.S. Application Data

(62) Division of application No. 15/264,590, filed on Sep. 13, 2016.

(30) Foreign Application Priority Data

Aug. 15, 2016 (TW) ............................ 105125890 A

(51) Int. Cl.

*H01L 27/14* (2006.01)
*H01L 21/8234* (2006.01)
*H01L 29/06* (2006.01)
*H01L 27/12* (2006.01)
*H01L 21/84* (2006.01)
*H01L 27/088* (2006.01)
*H01L 29/08* (2006.01)

(Continued)

(52) U.S. Cl.

CPC ................ *H01L 21/823481* (2013.01); *H01L 21/823418* (2013.01); *H01L 21/823431* (2013.01); *H01L 21/823437* (2013.01); *H01L 21/84* (2013.01); *H01L 27/0886* (2013.01); *H01L 27/1211* (2013.01); *H01L 29/0653* (2013.01); *H01L 29/0847* (2013.01); *H01L 21/8213* (2013.01); *H01L 29/66545* (2013.01)

(58) Field of Classification Search

CPC ...................................................... H01L 33/62
USPC .......................................................... 257/99
See application file for complete search history.

(56) References Cited

U.S. PATENT DOCUMENTS 9,123,773 B1 9/2015 Shen
2014/0227848 A1 8/2014 Kang (Continued)

*Primary Examiner* — Ajay Arora
(74) *Attorney, Agent, or Firm* — Winston Hu

(57) ABSTRACT

A semiconductor device includes a semiconductor substrate, an isolation structure, and a spacer. The semiconductor substrate includes at least one fin structure. The isolation structure is partly disposed in the fin structure and partly disposed above the fin structure. The fin structure includes a first fin and a second fin elongated in the same direction. A part of the isolation structure is disposed between the first fin and the second fin in the direction where the first fin and the second fin are elongated. The spacer is disposed on sidewalls of the isolation structure on the fin structure. The isolation structure in the present invention is partly disposed in the fin structure and partly disposed above the fin structure. The negative influence of a gate structure formed on the isolation structure and sinking into the isolation structure on the isolation performance of the isolation structure may be avoided accordingly.

10 Claims, 11 Drawing Sheets

H
30
A
A'
10F
10F
10F
10F
10F
10F
D2
D3
D1

(51) Int. Cl.

*H01L 21/82* (2006.01)
*H01L 29/66* (2006.01)

(56) References Cited

U.S. PATENT DOCUMENTS

2016/0111320 A1 4/2016 Shen
2016/0315100 A1 10/2016 Yang
2018/0047831 A1 * 2/2018 Xie .................. H01L 21/26513

* cited by examiner

MANUFACTURING METHOD OF SEMICONDUCTOR DEVICE

CROSS REFERENCE TO RELATED APPLICATIONS

This application is a division of application Ser. No. 15/264,590 filed on Sep. 13, 2016, now allowed, which is incorporated by reference herein in its entirety.

BACKGROUND OF THE INVENTION

1. Field of the Invention

The present invention relates to a semiconductor device and a manufacturing method thereof, and more particularly, to a semiconductor device including an isolation structure partly disposed in a fin structure and partly disposed on the fin structure and a manufacturing method thereof.

2. Description of the Prior Art

The development of semiconductor integrated circuit technology progresses continuously and circuit designs in products of the new generation become smaller and more complicated than those of the former generation. The amount and the density of the functional devices in each chip region are increased constantly according to the requirements of innovated products, and the size of each device has to become smaller accordingly. For operating the integrated circuit devices of different functions independently or cooperatively, an effective electrical isolation design is required to electrically isolating some of the integrated circuit devices from one another for preventing unwanted electrical coupling and/or unwanted electrical influence between adjacent components and devices. Therefore, for the related fields and industries, it is very important to improve the design of the electrical isolation structure integrated in the advanced process under the request for enhancing the integrity continuously.

SUMMARY OF THE INVENTION

A semiconductor device and a manufacturing method thereof are provided in the present invention. An isolation structure partly disposed in a fin structure and partly disposed on the fin structure is used to provide an isolation effect between different regions in the fin structure. A spacer is formed on sidewalls of the isolation structure on the fin structure, and there is no need to form a gate structure on the isolation structure. Negative influence of the gate structure formed on the isolation structure or sinking into the isolation structure on the isolation performance of the isolation structure may be avoided accordingly.

According to an embodiment of the present invention, a semiconductor device is provided. The semiconductor device includes a semiconductor substrate, an isolation structure, and a spacer. The semiconductor substrate includes at least one fin structure. The isolation structure is partly disposed in the fin structure and partly disposed on the fin structure. The fin structure includes a first fin and a second fin. The first fin and the second fin are elongated in a same direction, and a part of the isolation structure is disposed between the first fin and the second fin in the direction where the first fin and the second fin are elongated. The spacer is disposed on sidewalls of the isolation structure disposed on the fin structure.

According to an embodiment of the present invention, a manufacturing method of a semiconductor device is provided. The manufacturing method includes the following steps. A semiconductor substrate is provided, and the semiconductor substrate includes at least one fin structure. A patterned mask layer is formed on the fin structure. The patterned mask layer includes an opening corresponding to a part of the fin structure in a vertical direction. An etching process with the patterned mask layer as a mask is performed for forming a trench in the fin structure. A pullback process is performed to the patterned mask layer for enlarging the opening of the patterned mask layer. An isolation structure is formed in the trench and the enlarged opening of the patterned mask layer.

In the semiconductor device and the manufacturing method thereof in the present invention, the pullback process is used to enlarging the opening of the patterned mask layer after the step of forming the trench in the fin structure by the opening of the patterned mask layer, and the isolation structure is formed in the trench and the enlarged opening. In the isolation structure, a part formed on the fin structure may be formed and self-aligned with a part formed in the trench (i.e. a part formed in the fin structure), and the isolation structure partly formed in the fin structure and partly formed on the fin structure as required may be obtained accordingly.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-11 are schematic drawings illustrating a manufacturing method of a semiconductor device according to an embodiment of the present invention, wherein FIG. 2 is a cross-sectional diagram taken along a line A-A' in FIG. 1, FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, FIG. 8 and FIG. 9 are schematic drawings in a step subsequent to FIG. 7, FIG. 8 is a cross-sectional diagram taken along a line B-B' in FIG. 9, FIG. 10 and FIG. 11 are schematic drawings in a step subsequent to FIG. 8 and FIG. 9, and FIG. 10 is a cross-sectional diagram taken along a line C-C' in FIG. 11.

DETAILED DESCRIPTION

Figure 1:
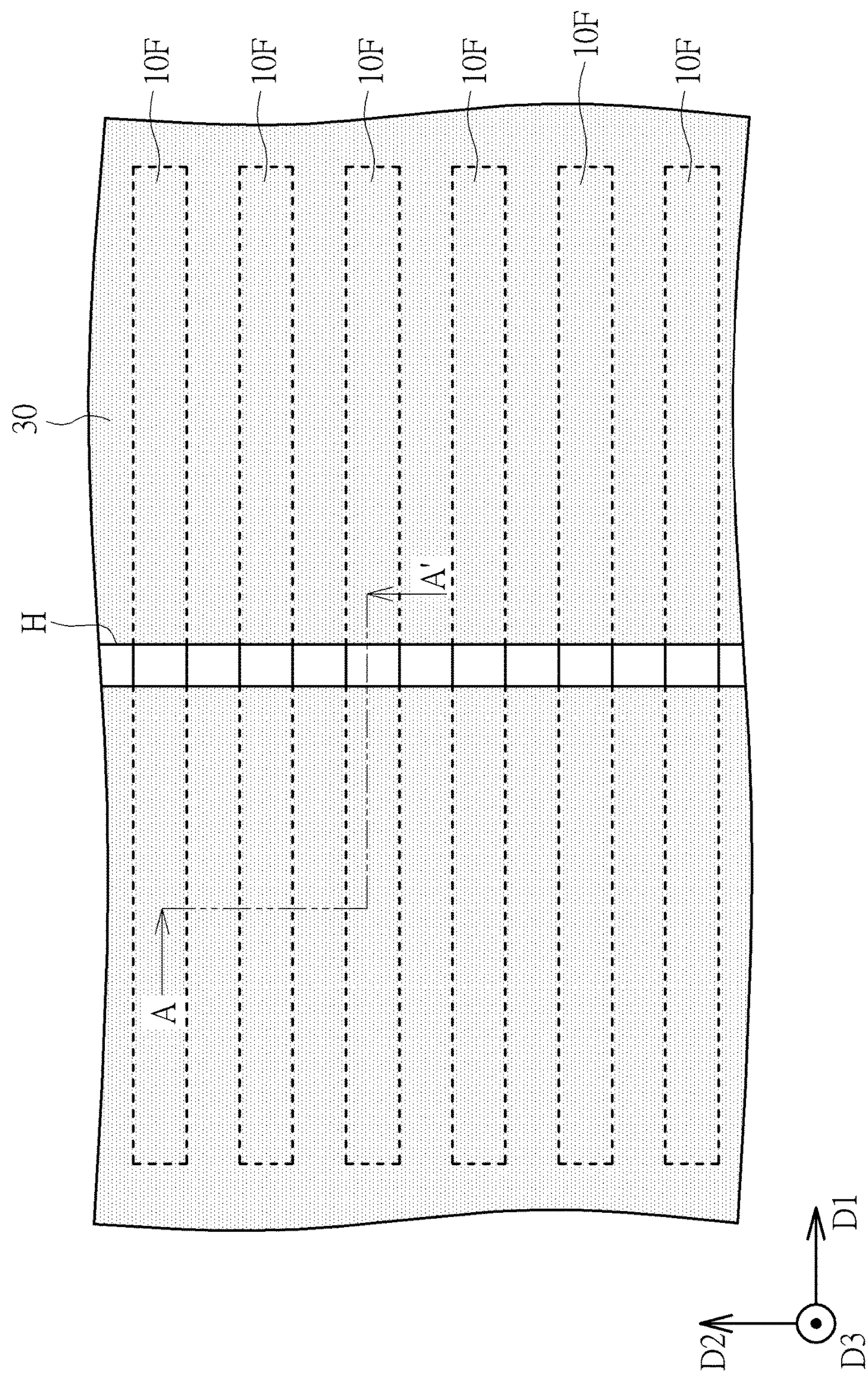
Figure 2:
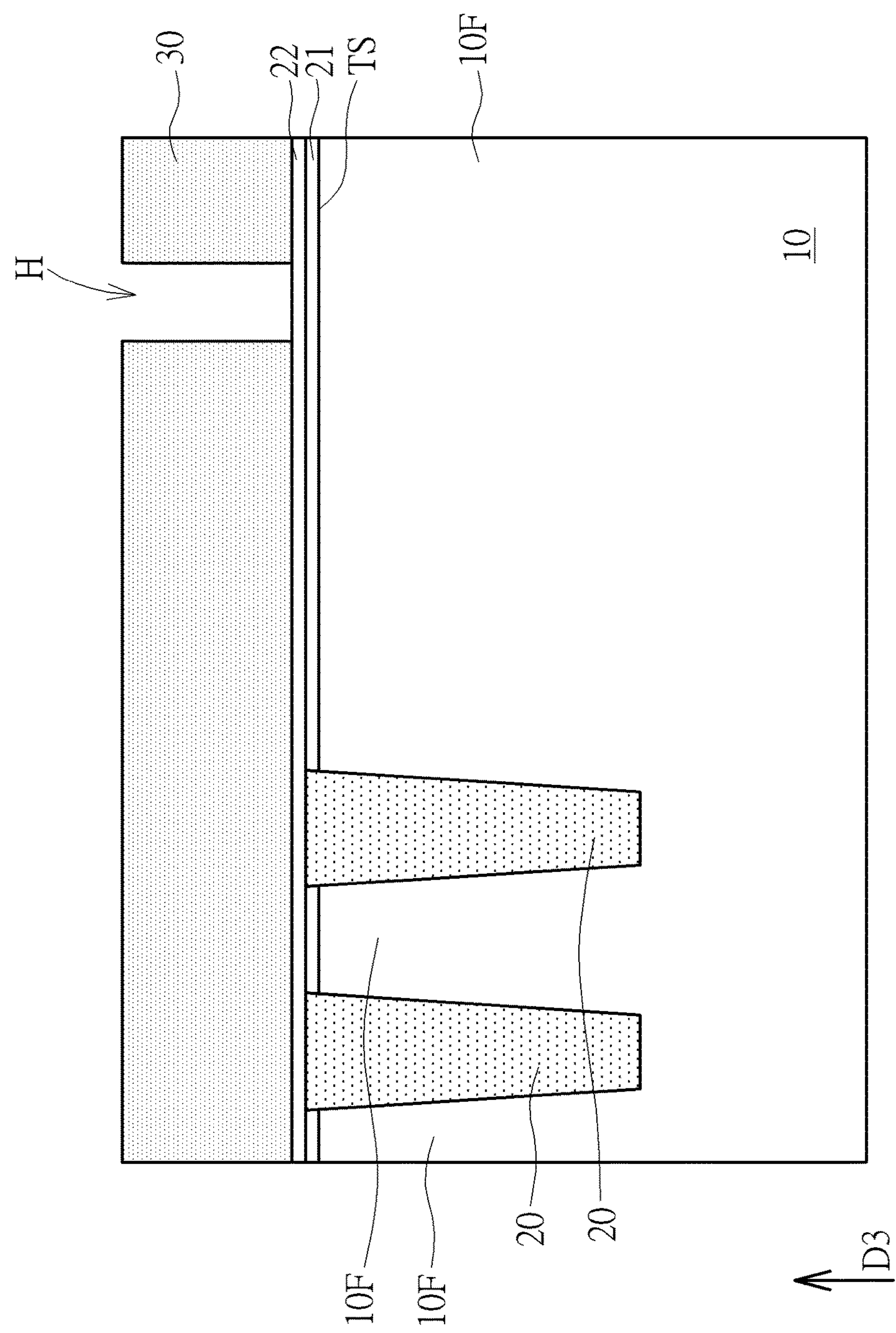
Figure 6:
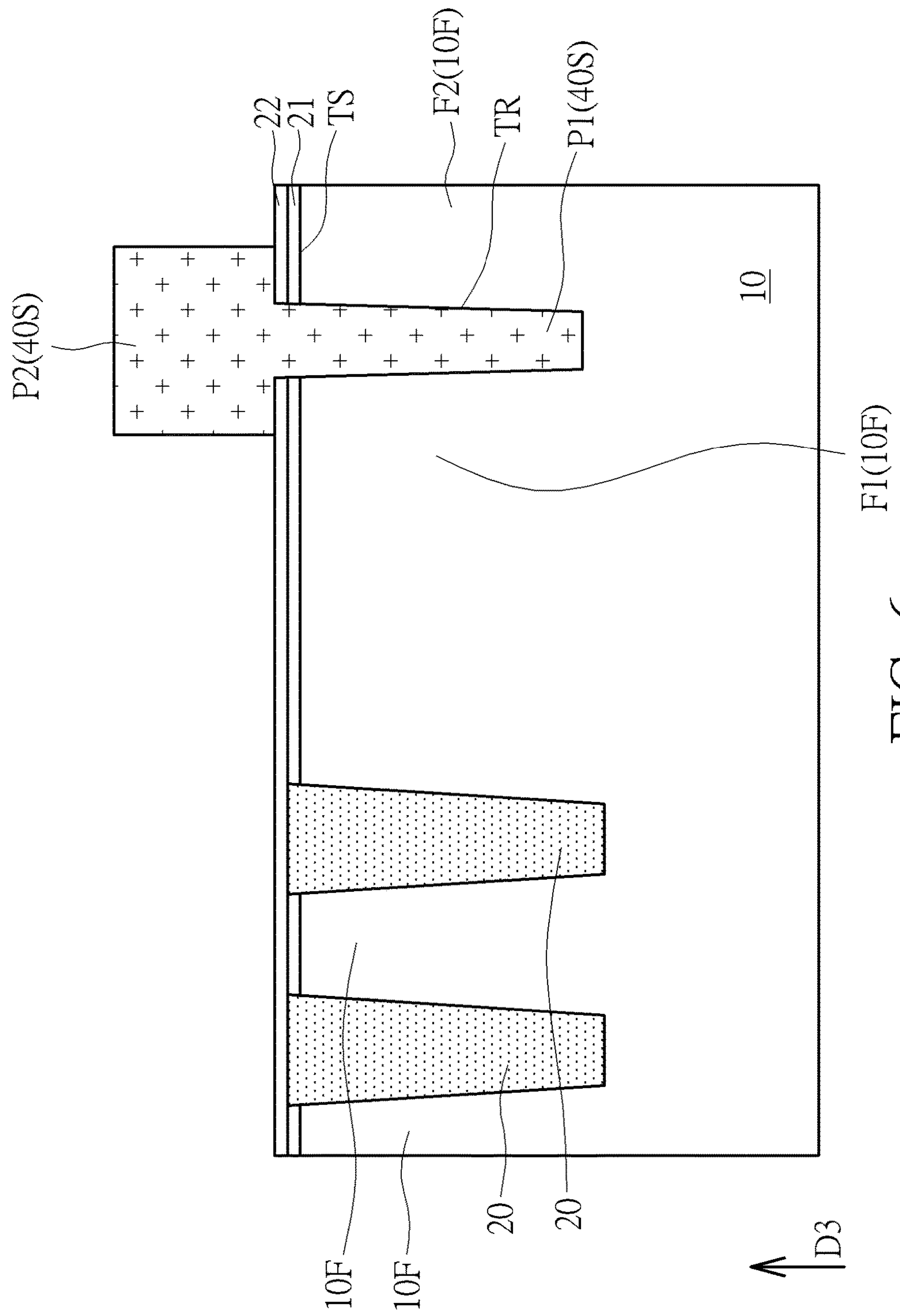
Figure 7:
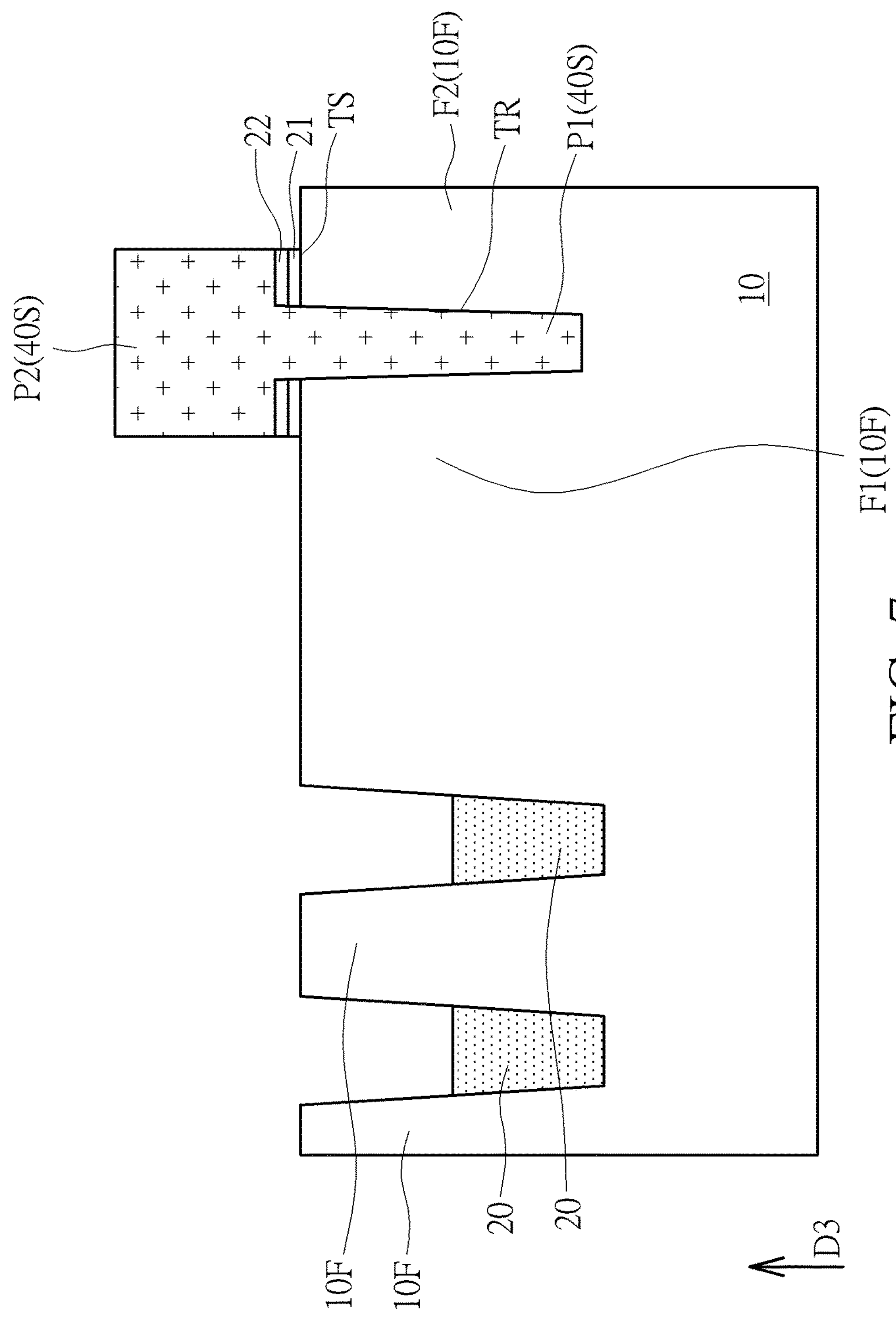
Figure 8:
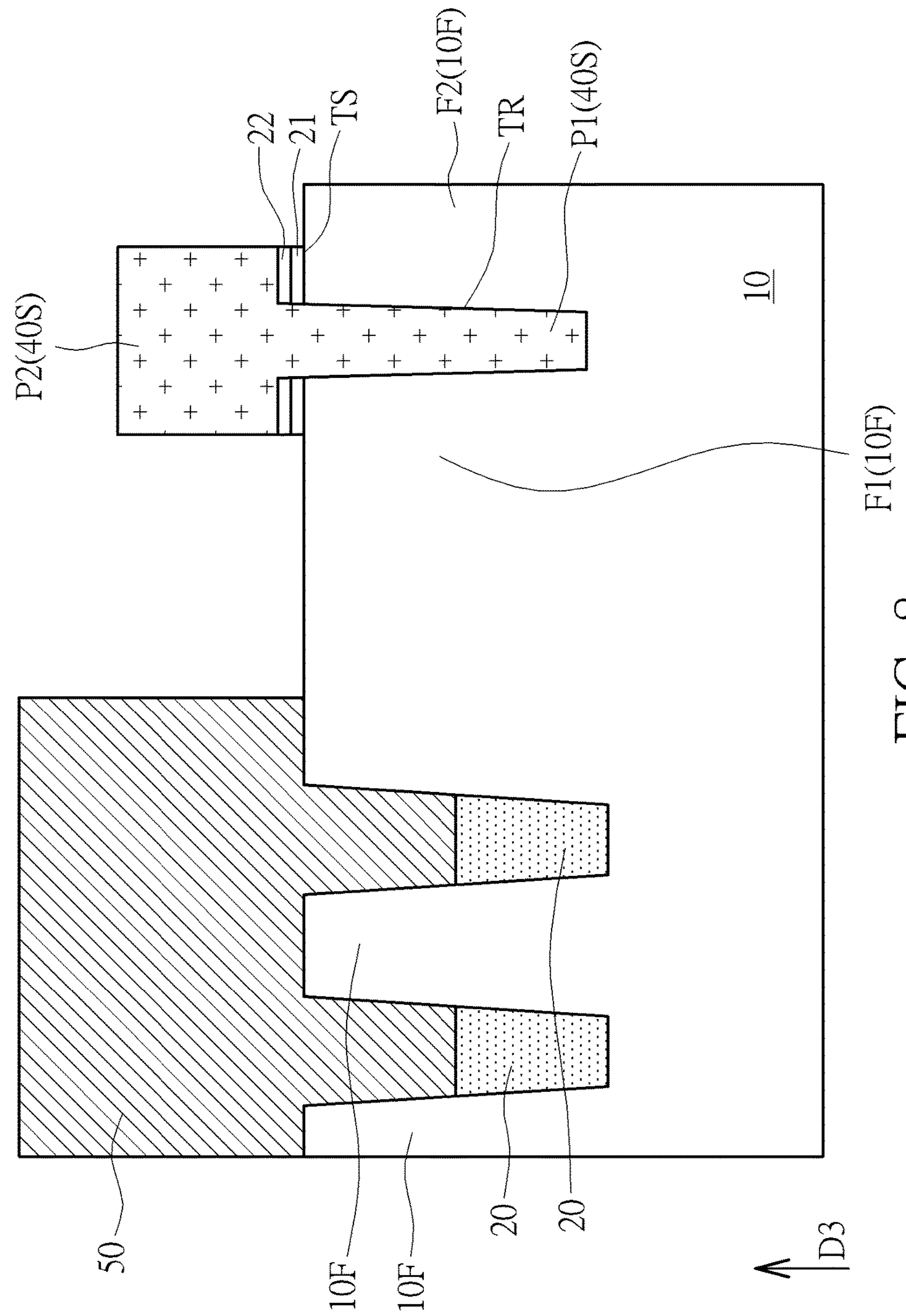
Figure 9:
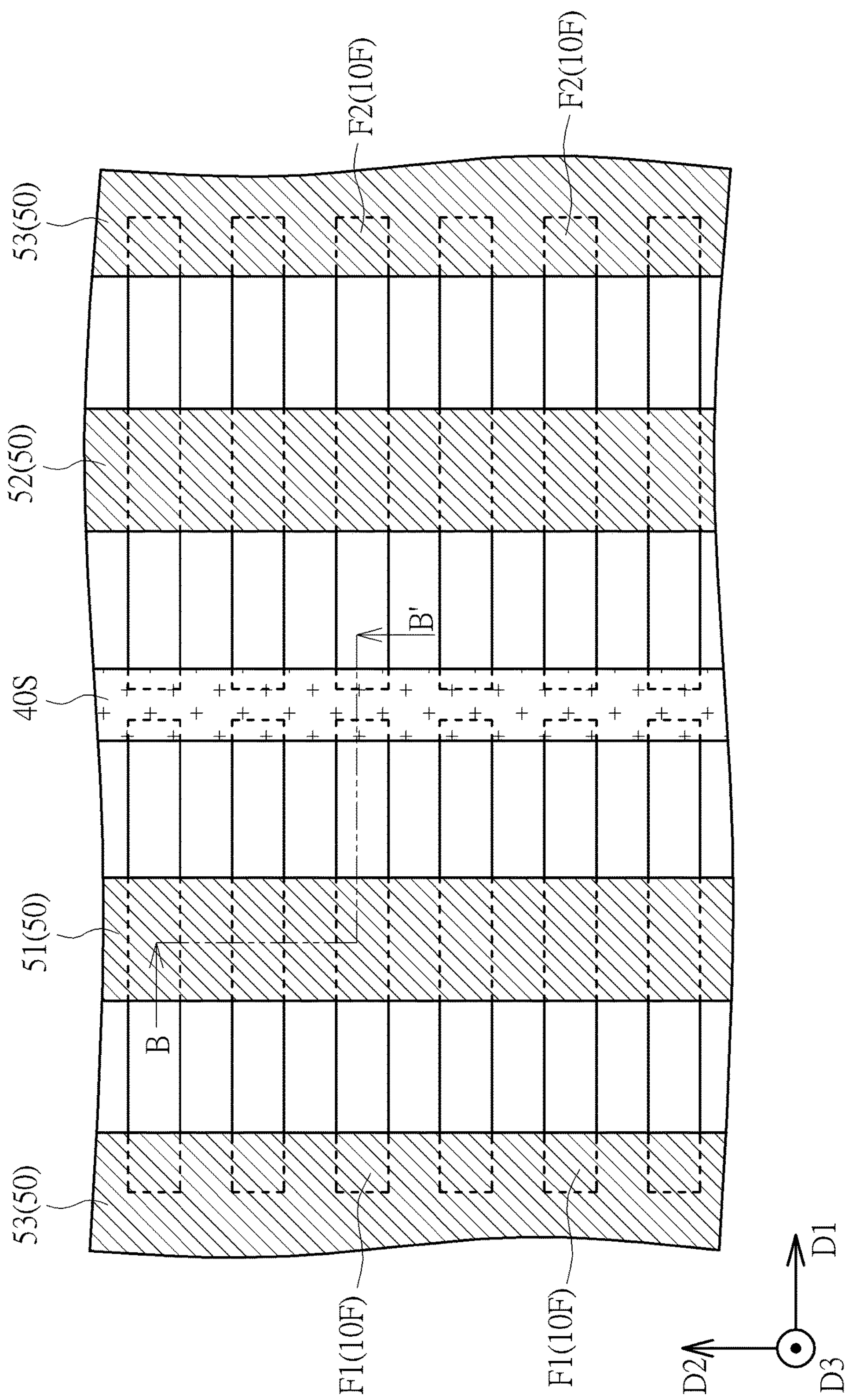
Figure 10:
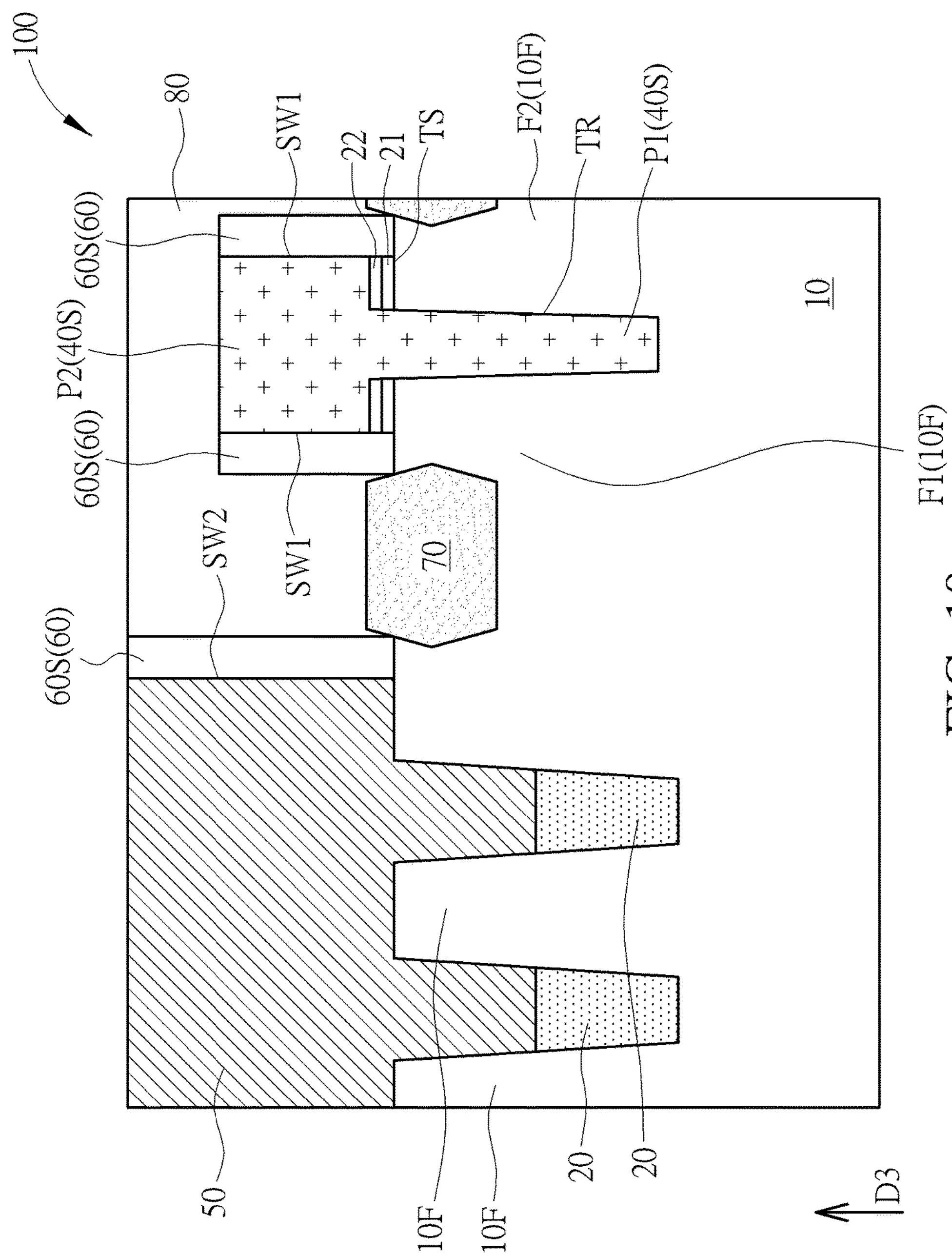
Figure 11:
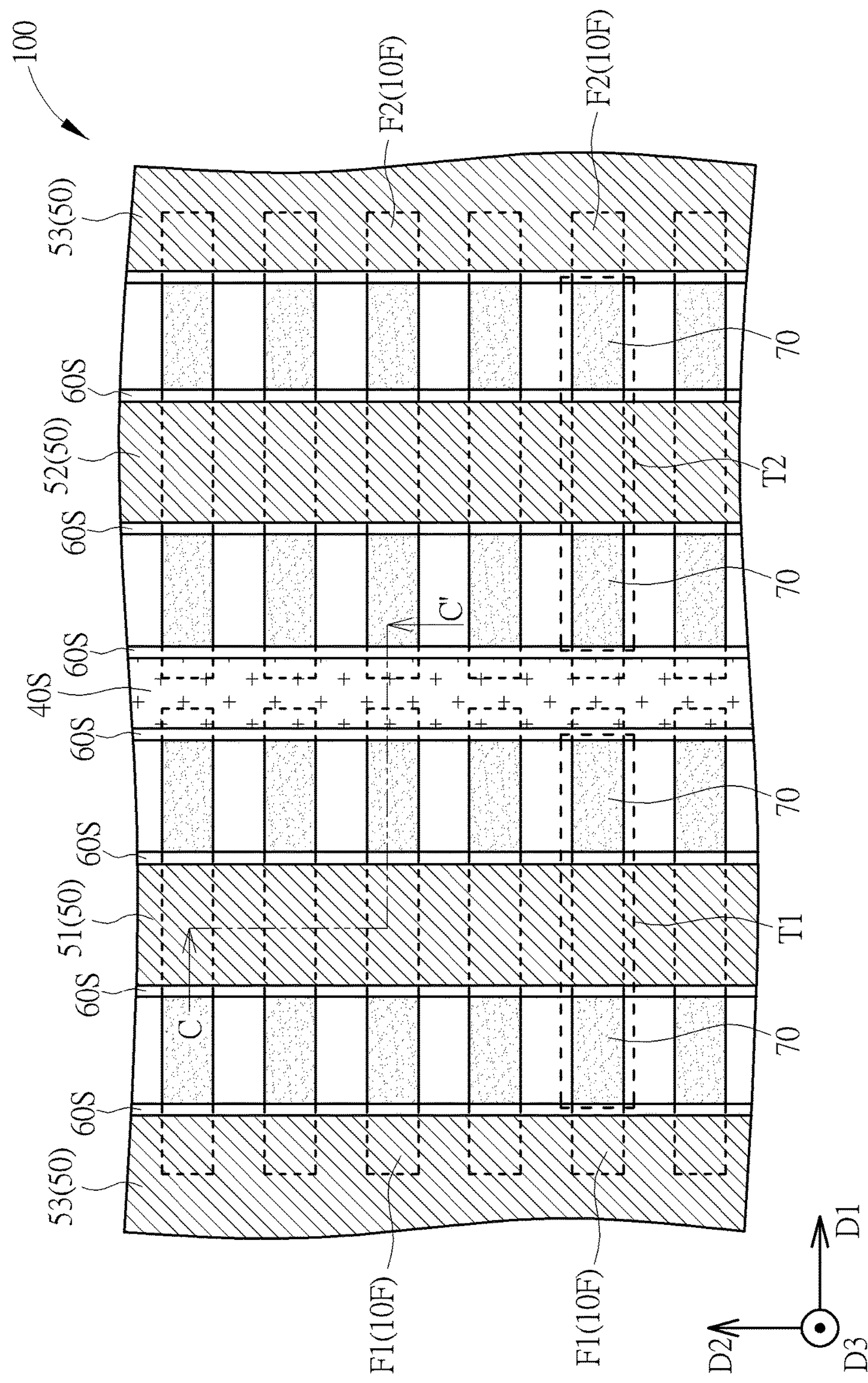

Please refer to FIGS. 1-11. FIGS. 1-11 are schematic drawings illustrating a manufacturing method of a semiconductor device according to an embodiment of the present invention. FIG. 1, FIG. 9, and FIG. 11 are top-view diagrams. FIGS. 2-8 and FIG. 10 are cross-sectional diagrams. FIG. 2 is a cross-sectional diagram taken along a line A-A' in FIG. 1, FIG. 8 is a cross-sectional diagram taken along a line B-B' in FIG. 9, and FIG. 10 is a cross-sectional diagram taken along a line C-C' in FIG. 11. The manufacturing method of the semiconductor device in this embodiment includes the following steps. As shown in FIG. 1 and FIG. 2, a semiconductor substrate 10 is provided. The semiconductor substrate 10 in this embodiment may include a silicon substrate, an epitaxial silicon substrate, a silicon germanium substrate, a silicon carbide substrate, or a silicon-on-insulator (SOI) substrate, but not limited thereto. The semiconductor substrate 10 includes at least one fin structure 10F, and the fin structure 10F includes a fin-shaped structure made of a semiconductor material. In this embodiment, the semiconductor substrate 10 may include a plurality of the fin structures 10F. Each of the fin structures 10F is elongated in a first direction D1, and the fin structures 10F are repeatedly disposed in a second direction D2. The first direction D1 may be substantially orthogonal to the second direction D2, but not limited thereto. The fin structures 10F may be formed by performing a patterning process, such as a multiple patterning process, to the semiconductor substrate 10. The fin structures 10F may be separated from one another by a shallow trench isolation (STI) structure 20. The shallow trench isolation structure 20 may be composed of a single layer or multiple layers of insulation materials, such as an oxide insulation material, but not limited thereto.

A patterned mask layer 30 is then formed on the fin structures 10F. The patterned mask layer 30 includes an opening H corresponding to a part of the fin structure 10F in a vertical direction D3. In some embodiments of the present invention, a first liner 21 may be selectively formed on the semiconductor substrate 10 before the patterning process performed to the semiconductor substrate 10 for forming the fin structures 10F, and a second liner 22 may be selectively formed on the first liner 21 and the shallow trench isolation 20 after the steps of forming the fin structures 10F and the shallow trench isolation 21 and before the step of forming the patterned mask layer 30. The first liner 21 and the second liner 22 may be formed by insulation materials, such as oxide insulation materials, respectively for providing a protection effect during other processes. However, in some embodiments, the opening H of the patterned mask layer 30 may directly expose a part of the fin structure 10F without forming the first liner 21 and the second liner 22 mentioned above. In other words, regardless of forming the first liner 21 and the second liner 22 mentioned above or not, the opening H of the patterned mask layer 30 is formed corresponding to a part of the fin structure 10F in the vertical direction D3 for forming a trench in the fin structure 10F by a subsequent etching process. In some embodiments, the opening H of the patterned mask layer 30 may be elongated in the second direction D2 for being corresponding to a plurality of the fin structures 10F, but not limited thereto. The material of the patterned mask layer 30 may include silicon nitride or other appropriate insulation materials. The patterned mask layer 30 may be formed by a photo etching process, a photo patterning process, or other suitable processes.

Figure 3:
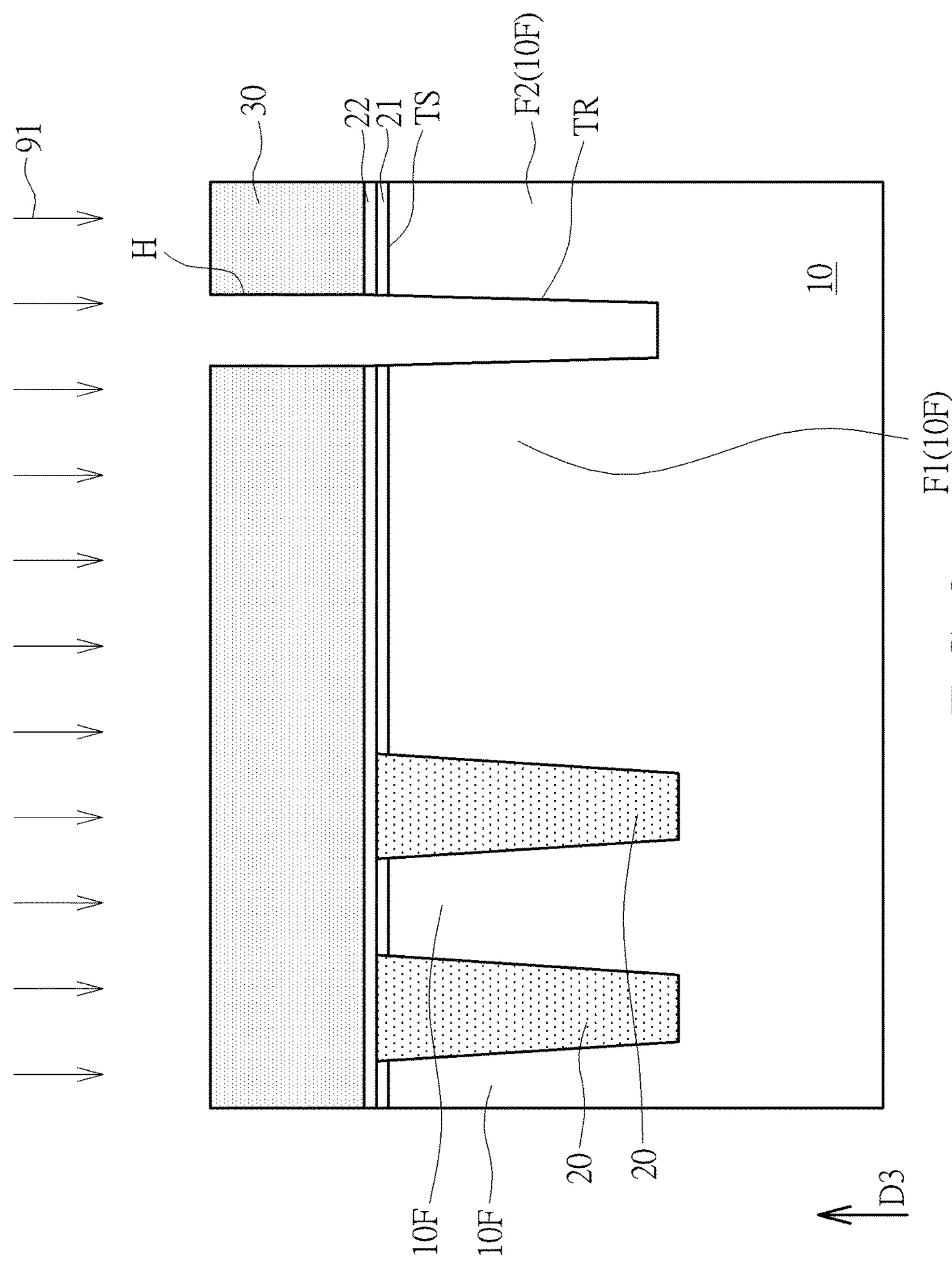

As shown in FIG. 3, an etching process 91 with the patterned mask layer 30 as a mask is performed for removing a part of the fin structure 10F corresponding to the opening H (may also be regarded as etching the fin structure 10F which is not covered by the patterned mask layer 30) and forming a trench TR in the fin structure 10F. A depth of the trench TR may be less than or equal to a depth of the shallow trench isolation 20 preferably, and a lowermost surface of the trench TR is higher than or substantially equal to a lowermost surface of the shallow trench isolation 20 preferably, but not limited thereto. Additionally, the etching process 91 may include one etching step or more etching steps with different process conditions for etching the first liner 21, the second liner 22, and the fin structure 10F respectively. The etching process 91 may include an anisotropic etching process preferably, such as an anisotropic dry etching process, for forming the trench TR having a higher aspect ratio, but not limited thereto. In addition, the fin structure 10F is cut by the trench TR and divided into a first fin F1 and a second fin F2. The first fin F1 and the second fin F2 are elongated in the same direction, and the trench TR is located between the first fin F1 and the second fin F2 of the same fin structure 10F.

Figure 4:
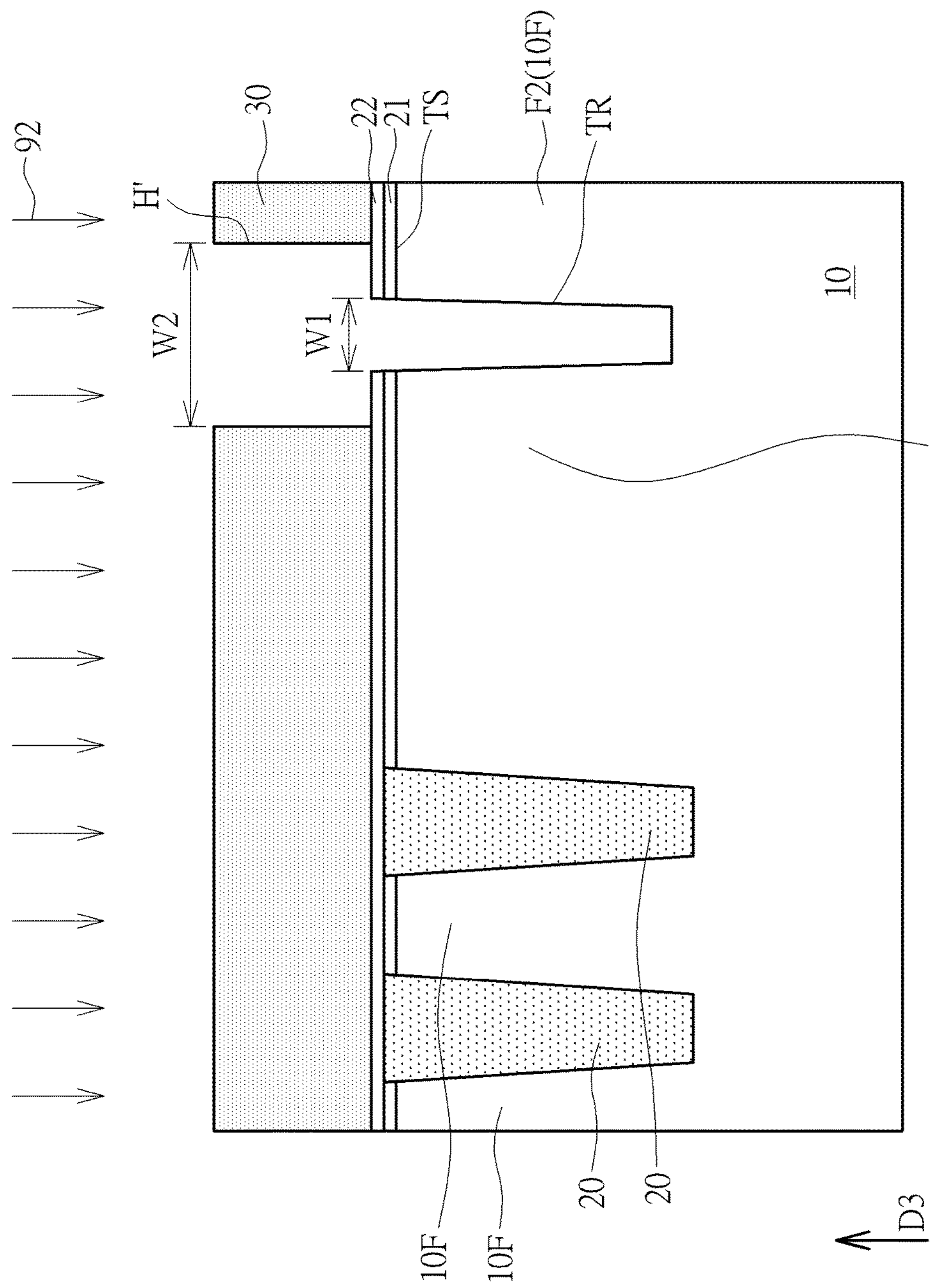

As shown in FIG. 3 and FIG. 4, a pullback process 92 is performed to the patterned mask layer 30 for enlarging the opening H of the patterned mask layer 30, and the opening H is converted into an enlarged opening H' by the pullback process 92. In some embodiments, the pullback process 92 may include a wet etching process or other processes having higher etching selectivity between the patterned mask layer 30 and other material layers for avoiding the influence on the shape and the size of the trench TR formed before the pullback process 92. In addition, a width W2 of the enlarged opening H' is larger than a width W1 of the trench TR, and the enlarged opening H' may be formed self-aligned with the trench TR by the pullback process 92 mentioned above. In some embodiments of the present invention, the enlarged opening may also be formed by other approaches, such as another photo etching process, but the alignment variation between the trench TR and the opening may become larger accordingly.

Figure 5:
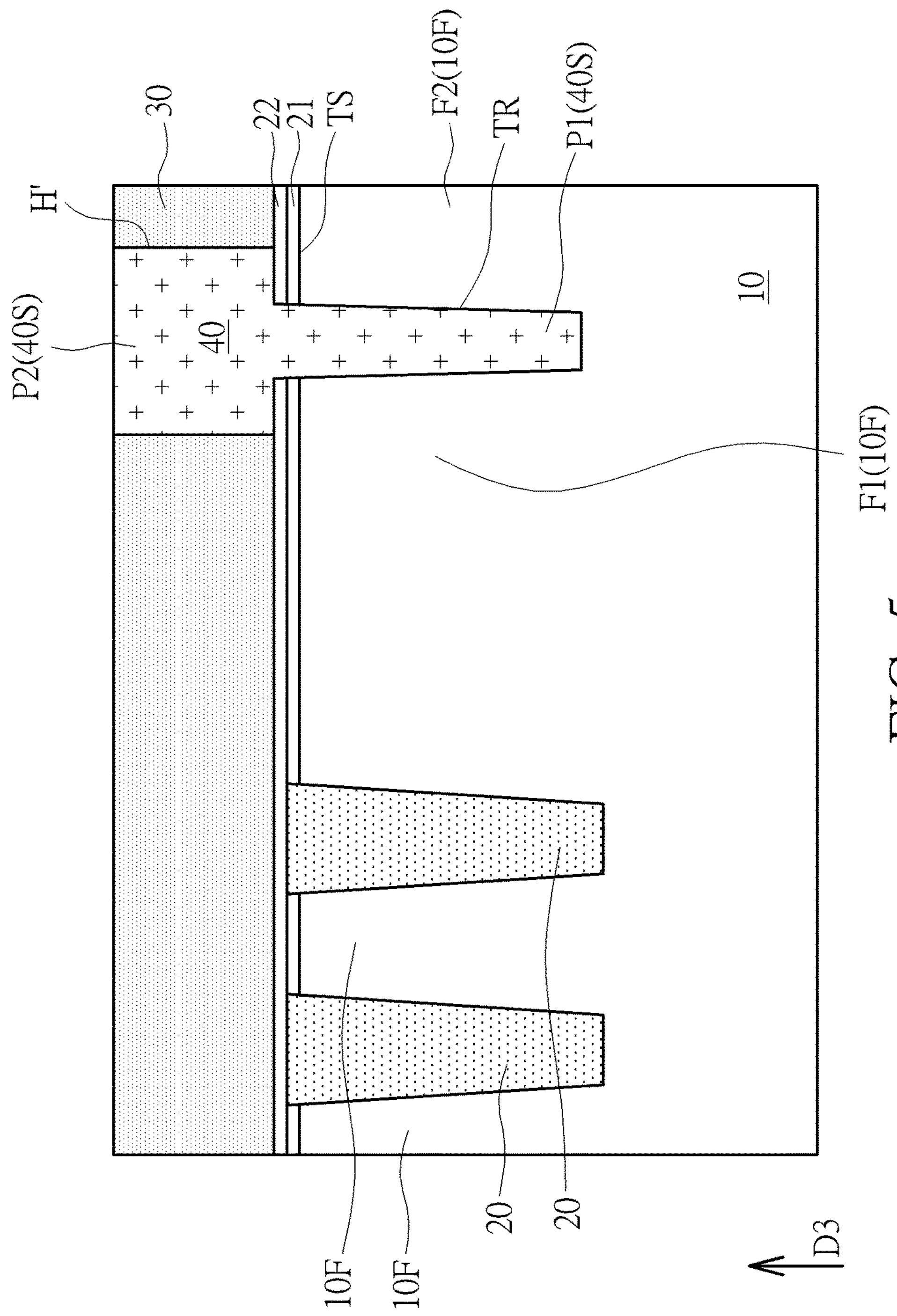

As shown in FIG. 5, an isolation structure 40S is then formed in the trench TR and the enlarged opening H' of the patterned mask layer 30. The method of forming the isolation structure 40S may include but is not limited to the following steps. An isolation material layer 40 may be formed in the trench TR, in the enlarged opening H' of the patterned mask layer 30, and on the patterned mask layer 30. The trench TR and the enlarged opening H' are filled with the isolation material layer 40. Subsequently, a planarization process is performed to remove the isolation material layer 40 on the patterned mask layer 30 for forming the isolation structure 40S. The isolation structure 40S may include a first part P1 formed in the fin structure 10F (i.e. formed in the trench TR) and a second part P2 forming on the first part P1 and the fin structure 10F because the isolation structure 40S is formed by filling the trench TR and the enlarged opening H' with the isolation material layer 40. The second part P2 is directly connected with the first part P1. The isolation material layer 40 may include insulation materials, such as an oxide insulation material, or other suitable materials. The isolation material layer 40 may be formed by a process such as a flowable chemical vapor deposition (FCVD) process for ensuring that the trench TR and the enlarged opening H' are filled with the isolation material layer 40 effectively, but not limited thereto. In addition, an anneal process may be performed for forming the isolation structure 40S after the FCVD process of forming the isolation material layer 40. In the isolation structure 40S formed by the method described above, a width of the first part P1 will be less than a width of the second part P2, and the second part P2 may also be regarded as being formed self-aligned with the first part P1. Accordingly, the first part P1 is formed between the first fin F1 and the second fin F2, and the second part P2 is formed on the first fin F1 and the second fin F2 simultaneously. Additionally, it is worth noting that a required height of the second part P2 of the isolation structure 40S may be obtained by controlling the thickness of the patterned mask layer 30 because the isolation structure 40S may be formed by filling the trench TR and the enlarged opening H' with the isolation material layer 40.

As shown in FIGS. 5-7, the patterned mask layer 30 is removed, and a process, such as a recessing process, may be performed to remove a part of the shallow trench isolation 20, a part of the first liner 21, and a part of the second liner 22 for exposing side surfaces and a part of a top surface TS of each fin structure 10F. After the recessing process mentioned above, a top surface of the shallow trench isolation 20 formed between the fin structures 10F is lower than the top surface TS of each of the fin structures 10F, and a top surface of the isolation structure 10F is higher than the top surface TS of each of the fin structures 10F. Additionally, a part of the first liner 21 and a part of the second liner 22 may remain between the second part P2 of the isolation structure 40S and the first fin F1 and remain between the second part P2 of the isolation structure 40S and the second fin F2 after the recessing process mentioned above.

As shown in FIG. 8 and FIG. 9, at least one gate structure 50 may be formed straddling the fin structure 10F. For example, the gate structure 50 may be elongated in the second direction D2, cross a plurality of the fin structures 10F, and be formed straddling the fin structures 10F. Therefore, the gate structure 50 may contact the top surface and two side surfaces of the fin structure 10F crossed by the gate structure 50, but not limited thereto. Additionally, in some embodiments, a plurality of the gate structures 50 may be formed separately from one another and parallel to one another, and the isolation structure 40S may be disposed parallel to the gate structures 50 also, but not limited thereto. For example, the gate structures 50 mentioned above may include a first gate structure 51, a second gate structure 52 and a third gate structure 53 disposed separately from one another and parallel to one another. The first gate structure 51 is formed straddling a plurality of the first fins F1, and the second gate structure 52 is formed straddling a plurality of the second fins F2. The isolation structure 40S is located between the first gate structure 51 and the second gate structure 52, and the second part P2 of the isolation structure 40S covers one end of the first fins F1 and one end of the second fins F2 in the vertical direction D3. Additionally, the third gate structure 53 may be formed at an end of each of the first fins F1 while the isolation structure 40S is formed at another end of each of the first fins F1 in the first direction D1, or be formed at an end of each of the second fins F2 while the isolation structure 40S is formed at another end of each of the second fins F2 in the first direction D1, and the third gate structure 53 may be regarded as a dummy gate structure, but not limited thereto. In some embodiments, the first gate structure 51 and the second gate structure 52 may be gate electrodes of different fin type semiconductor units respectively, and the first gate structure 51 and the second gate structure 52 may include conductive materials accordingly, but not limited thereto. However, in some embodiments, the first gate structure 51, the second gate structure 52, and the third gate structure 53 may be dummy gate structures for a replacement metal gate (RMG) process performed subsequently, and the materials of the first gate structure 51, the second gate structure 52, and the third gate structure 53 may include semiconductor materials such as amorphous silicon or polysilicon, but not limited thereto.

As shown in FIG. 10 and FIG. 11, a spacer 60S may be formed on sidewalls SW1 of the second part P2 of the isolation structure 40S and sidewalls SW2 of the gate structures 50. The method of forming the spacer 60S may include but is not limited to the following steps. For example, a spacer material layer 60 may be formed conformally on the surfaces of the gate structures 50, the isolation structure 40S, and the fin structures 10F first, and an anisotropic etching process may then be performed to remove a part of the spacer material layer 60 for forming the spacer 60S on the sidewalls SW1 of the isolation structure 40S and the sidewalls SW2 of the gate structures 50. The spacer material layer 60 may include oxide, nitride, oxynitride, or other suitable insulation materials, and the spacer 60S may be composed of a single spacer material layer or multiple spacer material layers. Subsequently, a plurality of source/drain regions 70 may be formed in the fin structures 10F, and each of the source/drain regions 70 is at least partially formed in the corresponding fin structure 10F. For example, each of the source/drain regions 70 may include an epitaxial structure extending upwards and beyond the top surface TS of the fin structure 10F, but not limited thereto. Additionally, a part of the source/drain regions 70 may be formed at two opposite sides of the first gate structure 51 in the first direction D1, and the other part of the source/drain regions 70 may be formed at two opposite sides of the second gate structure 52 in the first direction D1. Therefore, some of the source/drain regions 70 may be formed in the fin structure 10F between the isolation structure 40S and the gate structures 50, and each of these source/drain regions 70 may directly contact the spacer 60S formed on the sidewall SW1 of the second part P2 of the isolation structure 40S and the spacer 60S formed on the sidewall SW2 of the corresponding gate structure 50, but not limited thereto.

After the step of forming the source/drain regions 70, an interlayer dielectric 80 may be formed to cover the isolation structure 40S and the source/drain regions 70, and top surfaces of the gate structures 50 may not be covered by the interlayer dielectric 80 for forming metal gate structures (not shown) at the locations of the gate structures 50 by performing a replacement metal gate process to the gate structures 50 subsequently. In other words, the interlayer dielectric 80 covers the isolation structure 40S during the replacement metal gate process. There is no need to formed the gate structure 50 on the isolation structure 40S because the second part P2 of the isolation structure 40S is formed above the top surface TS of the fin structure 10F and may be used to formed the spacer 60S required in the subsequent process of forming the source/drain regions 70. The negative influence of the gate structure on the isolation performance of the isolation structure 70 may be avoided accordingly. For example, when the isolation structure 40S is composed of the first part P1 disposed in the fin structure 10F without the second part P2 disposed on the fin structure 10F, a gate structure has to be formed on the first part P1 and a spacer has to be formed on sidewalls of the gate structure for the subsequent process of the source/drain regions 70. However, negative influence may be generated by the gate structure formed on the isolation structure especially when the gate structure partially sinks into the isolation structure, and the isolation performance of the isolation structure will be affected accordingly. In other words, there is no need to formed a gate structure on the isolation structure 40S in the present invention because the isolation structure 40S is partly formed in the fin structure 10F and partly formed on the fin structure 10F, and the isolation effect of the isolation structure 40S for isolating the first fin F1 from the second fin F2 may be ensured accordingly.

After the manufacturing method described above, a semiconductor device 100 shown in FIG. 10 and FIG. 11 may be formed. The semiconductor device 100 includes the semiconductor substrate 10, the isolation structure 40S, and the spacer 60S. The semiconductor substrate 10 includes at least one fin structure 10F. The isolation structure 40S is partly disposed in the fin structure 10F and partly disposed on the fin structure 10F. The fin structure 10F includes a first fin F1 and a second fin F2. The first fin F1 and the second fin F2 are elongated in a same direction (such as the first direction D1 shown in FIG. 11), and a part of the isolation structure 40S is disposed between the first fin F1 and the second fin F2 in the direction where the first fin F1 and the second fin F2 are elongated. The spacer 60S is disposed on the sidewalls SW1 of the isolation structure 40S disposed on the fin structure 10F.

Additionally, the semiconductor device 100 may further include a plurality of the gate structures 50, such as the first gate structure 51, the second gate structure 52, and the third gate structure 53. The first gate structure 51, the second gate structure 52, and the third gate structure 53 are disposed and elongated in the second direction D2. The top surface of the gate structure 50 is higher than or located on the same level with the top surface of the isolation structure 40S in the vertical direction D3 preferably, but not limited thereto. The first gate structure 51 is disposed on the first fin F1 and disposed straddling the first fin F1. The second gate structure 52 is disposed on the second fin F2 and disposed straddling the second fin F2. The isolation structure 40S is disposed between the first fin F1 and the second fin F2 in the first direction D1. The isolation structure 40S, the first gate structure 51, the second gate structure 52, and the third gate structure 53 may be disposed parallel to one another. Each of the gate structures 50 may include a gate dielectric layer (not shown) disposed at a side adjacent to the fin structure. In addition, the spacer 60S may be further disposed on the sidewalls of the first gate structure 51 and the sidewalls of the second gate structure 52, and the semiconductor device 100 may further include a plurality of the source/drain regions 70. Each of the source/drain regions 70 is at least partially disposed in the fin structure 10F. A part of the source/drain regions 70 are disposed at two opposite sides of the first gate structure 51 in the direction where the first fin F1 and the second fin F2 are elongated (such as the first direction D1 shown in FIG. 11), and the other part of the source/drain regions 70 are disposed at two opposite sides of the second gate structure 52 in the direction where the first fin F1 and the second fin F2 are elongated. Some of the source/drain regions 70 are disposed between the isolation structure 40S and the first gate structure 51 in the direction where the first fin F1 and the second fin F2 are elongated or disposed between the isolation structure 40S and the second gate structure 52.

In some embodiments, the first gate structure 51 (or the metal gate structure formed at the location of the first gate structure 51 by the replacement metal gate process), the first fin F1, and the source/drain regions 70 disposed in the first fin F1 at two sides of the first gate structure 51 may form a first semiconductor unit T1. The second gate structure 52 (or the metal gate structure formed at the location of the second gate structure 52 by the replacement metal gate process), the second fin F2, and the source/drain regions 70 disposed in the second fin F2 at two sides of the second gate structure 52 may form a second semiconductor unit T2. The isolation structure 40S is disposed between the first semiconductor unit T1 and the second semiconductor unit T2 for providing the isolation effect. The isolation structure 40S may include the first part P1 disposed in the fin structure 10F and the second part P2 disposed on the first part P1 and the fin structure 10F because the isolation structure 40S may be formed by the method shown in FIGS. 2-6 mentioned above, for example. The second part P2 is directly connected to the first part P1, and the spacer 60S is disposed on the sidewall SW1 of the second part P2 of the isolation structure 40S. The second part P2 of the isolation structure 40S is disposed on the first fin F1 and the second fin F2 simultaneously in the vertical direction D3. In some embodiments, the first part P1 of the isolation structure 40S may be surrounded by a liner (not shown), and the second part P2 of the isolation structure 40S may be directly contact the spacer 60S, but not limited thereto.

In cross-sectional view of the semiconductor device 100 (such as FIG. 10), the isolation structure 40S may include a T-shaped structure, and the isolation structure 40S may be regarded as a single diffusion break (SDB) structure, but not limited thereto. Additionally, the semiconductor device 100 may further include the interlayer dielectric 80. The interlayer dielectric 80 is disposed directly on the isolation structure 40S, and the semiconductor device 100 shown in FIG. 10 may be regarded as a condition before a replacement metal gate process for forming a metal gate structure at the location of the gate structure 50, but not limited thereto. In some embodiments, the first gate structure 51 and the second gate structure 52 of the semiconductor device 100 may be the gate electrode of the first semiconductor unit T1 and the gate electrode of the second semiconductor unit T2 respectively, and the semiconductor device 100 may be regarded as a semiconductor device including a plurality of fin type semiconductor units.

To summarize the above descriptions, in the semiconductor device and the manufacturing method thereof according to the present invention, the pullback process is used to enlarging the opening of the patterned mask layer after the step of forming the trench in the fin structure by the opening of the patterned mask layer, and the isolation structure is formed in the trench and the enlarged opening. Therefore, the second part of the isolation structure formed on the fin structure may be formed self-aligned with the first part of the isolation structure formed in the fin structure, and the isolation structure partly formed in the fin structure and partly formed on the fin structure as required may be obtained accordingly. Additionally, based on the isolation structure of the present invention, there is no need to forma gate structure on the isolation structure. The negative influence of the gate structure formed on the isolation structure may be avoided, and the isolation performance of the isolation structure may be ensured accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of manufacturing a semiconductor device, comprising:

providing a semiconductor substrate, wherein the semiconductor substrate comprises at least one fin structure;

forming a patterned mask layer on the fin structure, wherein the patterned mask layer comprises an opening corresponding to a part of the fin structure in a vertical direction;

performing an etching process with the patterned mask layer as a mask for forming a trench in the fin structure;

performing a pullback process to the patterned mask layer for enlarging the opening of the patterned mask layer; and forming an isolation structure in the trench and the enlarged opening of the patterned mask layer.

2. The method of manufacturing the semiconductor device according to claim 1, wherein the step of forming the isolation structure comprises:

forming an isolation material layer in the trench, in the enlarged opening of the patterned mask layer, and on the patterned mask layer, wherein the enlarged opening and the trench are filled with the isolation material layer; and performing a planarization process to remove the isolation material layer on the patterned mask layer.

3. The method of manufacturing the semiconductor device according to claim 1, wherein the isolation structure comprises:

a first part formed in the trench; and a second part formed on the first part and the fin structure, wherein the second part is directly connected to the first part.

4. The method of manufacturing the semiconductor device according to claim 3, wherein the fin structure is divided into a first fin and a second fin by the trench, the first fin and the second fin are elongated in a same direction, and the first part of the isolation structure is formed between the first fin and the second fin.

5. The method of manufacturing the semiconductor device according to claim 4, wherein the second part of the isolation structure is formed on the first fin and the second fin.

6. The method of manufacturing the semiconductor device according to claim 3, further comprising:

forming a spacer on sidewalls of the first part of the isolation structure on the fin structure.

7. The method of manufacturing the semiconductor device according to claim 6, further comprising:

forming at least one gate structure straddling the fin structure, wherein the spacer is further formed on sidewalls of the gate structure.

8. The method of manufacturing the semiconductor device according to claim 7, wherein the gate structure and the isolation structure are parallel to each other.

9. The method of manufacturing the semiconductor device according to claim 7, further comprising:

forming a source/drain region in the fin structure between the gate structure and the isolation structure.

10. The method of manufacturing the semiconductor device according to claim 1, wherein the pullback process comprises a wet etching process for etching the patterned mask layer and enlarging the opening of the patterned mask layer.

* * * * *